(12) United States Patent
Anupindi et al.

(10) Patent No.: US 8,179,094 B2
(45) Date of Patent: May 15, 2012

(54) DEVICE AND METHOD FOR IMPROVED BATTERY CONDITION LEARN CYCLE

(75) Inventors: Lakshmana Anupindi, Suwanee, GA (US); Brian Skinner, Gainesville, GA (US)

(73) Assignee: LSI Corporation, Milpitas, CA (US)

( * ) Notice: Subject to any disclaimer, the term of this patent is extended or adjusted under 35 U.S.C. 154(b) by 335 days.

(21) Appl. No.: 12/444,009

(22) PCT Filed: Mar. 27, 2008

(86) PCT No.: PCT/US2008/058387
§ 371 (c)(1),
(2), (4) Date: Apr. 2, 2009

(87) PCT Pub. No.: WO2009/120195
PCT Pub. Date: Oct. 1, 2009

(65) Prior Publication Data
US 2010/0194341 A1  Aug. 5, 2010

(51) Int. Cl.
*H02J 7/00* (2006.01)
*H02J 1/10* (2006.01)
*H02J 3/38* (2006.01)
*G01N 27/42* (2006.01)
*G01N 27/416* (2006.01)

(52) U.S. Cl. ........ 320/132; 320/134; 320/136; 324/425; 324/426; 324/427; 324/430; 324/432; 307/23; 307/25; 307/29; 307/44; 307/48

(58) Field of Classification Search ................... 320/132
See application file for complete search history.

(56) References Cited

U.S. PATENT DOCUMENTS

| | | | |
|---|---|---|---|
| 2005/0029986 A1* | 2/2005 | Morgan | 320/118 |
| 2006/0277422 A1* | 12/2006 | Berke et al. | 713/300 |
| 2007/0166617 A1* | 7/2007 | Gozdz et al. | 429/231.95 |
| 2008/0224709 A1* | 9/2008 | Tae et al. | 324/430 |

\* cited by examiner

*Primary Examiner* — Edward Tso
*Assistant Examiner* — Ahmed Omar

(57) ABSTRACT

Embodiments of the invention include a device and method for improved battery learn cycles for battery backup units within data storage devices. The backup unit includes a first battery pack, a corresponding charge capacity gauge, one or more second battery packs, a corresponding charge capacity gauge, and a controller switch configured to select only one battery pack for a learn cycle at any given time. The charge capacity gauges are such that, at the end of the learn cycle discharge phase, the depth of discharge of the learn cycle battery pack is such that the charge capacity of the learn cycle battery pack combined with the full charge capacity of the remaining battery packs is sufficient for the device cached data to be off-loaded to a physical data storage device, and the data storage device does not have to switch from a write-back cache mode to a write-through cache mode.

20 Claims, 3 Drawing Sheets

DEVICE AND METHOD FOR IMPROVED BATTERY CONDITION LEARN CYCLE

BACKGROUND OF THE INVENTION

1. Field of the Invention

The invention relates to learn cycles for batteries, such as batteries used in a battery backup unit (BBU) for a data storage system or device. More particularly, the invention relates to methods and devices for improving battery learn cycles in a manner that improves the accuracy of battery capacity readings while managing the data cache policy to avoid system performance degradation.

2. Description of the Related Art

Many data storage systems and devices include a battery backup unit (BBU) that provides reserve power and data integrity in the event that the storage device's main power supply loses power. Typically, the battery backup unit includes one or more rechargeable batteries that are charged by a corresponding power supply. Batteries used for such battery backup units typically are rechargeable batteries of one of a variety types, such as nickel cadmium, nickel metal hydride or lithium ion.

A battery learn cycle is a battery calibration operation performed periodically, e.g., approximately every 3 months, to determine the condition of a battery, such as a rechargeable lithium ion battery included as part of a battery backup unit for a data storage system or device. The battery learn cycle typically is performed by a controller in the device within which the battery resides. The battery learn cycle, which can take from a few hours to up to ten hours, includes the process of discharging and then fully charging the battery. The battery learn cycle also updates the tracked battery parameters (e.g., capacity, voltage, current, temperature and impedance) inside the integrated circuit so that a cache controller can determine whether the battery can maintain the controller cache (i.e., the data written by the cache controller to the cache memory of the device) for a prescribed period of time in the event of a power loss. For example, some batteries are required to maintain the controller cache for 72 hours in the event of AC power loss.

Within many electronic data storage devices, during data read and write operations, the cache controller writes a block of data to cache memory, which is much faster than writing to a physical disk. The cache controller sends an acknowledgement of data transfer completion to the host system. If the controller is using a write-back cache policy, the controller sends a data transfer completion signal to the host when the controller cache has received all the data in a transaction. The cached data is not written to the storage device. The controller then writes the cached data to the storage device when system activity is low or when the write buffer approaches capacity. The risk of using write-back cache is that the cached data can be lost if there is a power failure before the cache data is written to the storage device. While a battery learn cycle is in progress, the battery may not be able to maintain the controller cache during a power loss.

During a battery learn cycle of a battery backup unit, if the controller is using a write-back cache policy, the controller typically changes to a write-through cache policy until the learn cycle completes. In write-through caching, the controller sends a data transfer completion signal to the host system when the disk subsystem has received all the data in a transaction. Write-through cache policy writes the data directly to the disk and reduces the risk that data can be lost in the cache if there is a power loss to the device. However, compared to write-back caching, write-through caching degrades the overall system performance.

Conventional attempts to improve upon the shortcomings of switching from write-back caching to write-through caching during the battery learn cycle of a battery backup unit include increasing the size and capacity of the BBU battery pack to support the load yet still allow the BBU battery to be fully discharged, e.g., an 80% depth of discharge (DOD), to coulomb count the battery charge capacity. However, such oversizing approach unnecessarily increases the volume and cost of the battery backup unit, as well as the time required to perform an 80% DOD battery discharge. Therefore, there still is a need to avoid or prevent the switching of the cache policy from a write-back cache policy to a write-through cache policy during the battery learn cycle for a BBU battery, while still maintaining sufficient battery backup protection to preserve cache data and without degrading the performance of the overall system.

SUMMARY OF THE INVENTION

The invention is embodied in a device and method for improving battery learn cycles, e.g., for batteries that are part of a battery backup unit (BBU) within an electronic data storage system or device. The battery backup unit includes a first battery pack, a first battery charge capacity gauge coupled to the first battery pack, one or more second battery packs, a second battery charge capacity gauge coupled to the second battery pack, and a controller switch coupled between the first battery pack and the at least one second battery pack. The controller switch is configured to select no more than one battery pack for a battery condition learn cycle at any given time. The battery charge capacity gauges are configured such that, during the discharge phase of a battery condition learn cycle performed on the battery pack selected for a learn cycle, the depth of discharge of the selected battery pack is such that the capacity at the end of the discharge phase of the learn cycle of the battery pack being discharged combined with the full charge capacity of the battery pack or packs not selected for the learn cycle is sufficient to allow the data stored in the cache memory of the data storage device to be off-loaded to a physical data storage device coupled to the data storage device. The combined charge capacity level of the learn cycle battery pack and the battery pack or packs not selected for the learn cycle eliminates the need for the data storage device to switch its cache policy from a write-back cache mode to a write-through cache mode, thus reducing any system performance degradation caused by using the write-through cache mode.

DETAILED DESCRIPTION OF EXEMPLARY EMBODIMENTS

Figure 1:
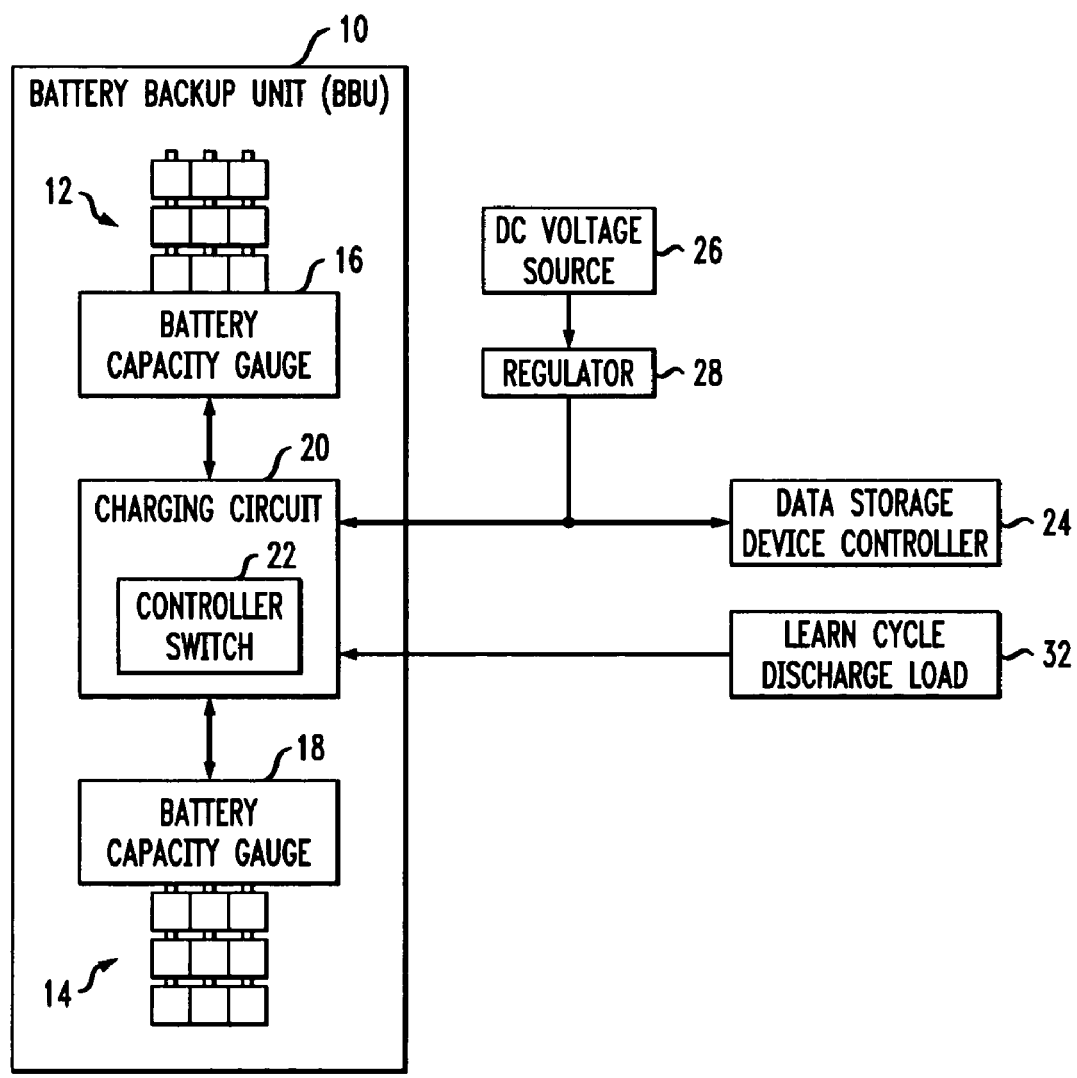
FIG. 1 is a schematic view of a battery backup unit (BBU), for use with an electronic data storage system or device, according to embodiments of the invention.

In the following description, like reference numerals indicate like components to enhance the understanding of the invention through the description of the drawings. Also, although specific features, configurations and arrangements are discussed hereinbelow, it should be understood that such is done for illustrative purposes only. A person skilled in the relevant art will recognize that other steps, configurations and arrangements are useful without departing from the spirit and scope of the invention.

Within electronic data storage devices, writing a block of data to cache memory is much faster than writing the data to a storage device, such as a disk or other physical storage device. The electronic data storage device then writes the cached data to the storage device when device system activity is low or when the cache is becoming full. The risk of using a write-back cache policy is that the cached data can be lost if the device's power fails before the cached data has been written to the storage device. This risk factor is eliminated when the data storage device includes a battery backup unit (BBU), which generally provides a relatively inexpensive alternative to using an uninterruptible power supply (UPS).

The battery backup unit monitors the voltage level of one or more portions of the data storage device, such as the dynamic random access memory (DRAM) modules. If the voltage level drops below a threshold level, the system power source is switched to the battery pack within the battery backup unit. As long as the voltage level stays below the threshold value, the battery backup unit provides power for the system. If the voltage level returns to an acceptable level, the power source is switched from the battery backup unit back to the device's normal power supply.

As discussed hereinabove, when a battery learn cycle is being performed on BBU battery, the battery may not be able to maintain cached data during a power loss. Therefore, to reduce the risk of possibly losing the cached data, if the device's system controller is using a write-back cache policy, the controller typically changes to a write-through cache policy until the battery learn cycle is completed. The system controller typically monitors the capacity of the BBU battery, and when the battery's capacity drops below a threshold level, e.g., during the discharge phase of the battery's learn cycle, the controller changes from a write-back cache policy to a write-through cache policy. However, as discussed hereinabove, compared to write-back caching, write-through caching reduces the overall performance of the data storage device.

According to embodiments of the invention, the battery backup unit includes a plurality of battery cells arranged or configured as two or more separate battery packs or sets of battery packs, and any battery learn cycle is performed on only one of the battery packs at any given time, while the other battery pack or packs remains at full charge capacity. In this manner, the collective or combined capacity of the battery pack being discharged as part of its battery learn cycle and the battery pack or packs remaining at full charge capacity is sufficient to prevent the device system controller from switching the cache policy from write-back caching to write-through caching. Moreover, embodiments of the invention also make use of various battery charge capacity gauges, such as impedance tracking gas gauges, that do not require conventional depth of discharge (DOD) levels for the battery pack to be considered fully discharged for purposes of the battery pack learn cycle and the subsequent determination of the battery pack's available charge capacity. The reduced DOD level during the learn cycle battery pack's discharge phase allows the collective capacity of the learn cycle battery pack and the battery pack remaining at full charge capacity to remain at a level that does not drop below the system controller's threshold level for switching from write-back caching to write-through caching.

Referring now to FIG. 1, shown is a schematic view of a battery backup unit (BBU) 10, for use with an electronic data storage system or device, according to embodiments of the invention. The battery backup unit 10 protects the integrity of cached data stored in the cache memory portion of the electronic data storage device by providing backup power if there is a complete power failure or a brief power outage. The battery backup unit 10 includes a plurality of battery cells configured as a first battery or battery pack 12 and a second battery or battery pack 14. It should be understood that, although only two battery packs are shown, the battery backup unit 10 can include more than two battery packs. The battery backup unit 10 also includes a first battery charge capacity gauge 16 coupled to the first battery pack 12, a second battery charge capacity gauge 18 coupled to the second battery pack 14, and a charging circuit or smart charger 20 (including a controller switch 22) coupled between the first and second battery packs 12, 14, e.g., via the first and second battery charge capacity gauges 16, 18.

Integrated firmware within the charging circuit 20, which can include the controller switch 22, is configured to communicate with the system or device controller for the electronic data storage system, which is shown generally as a data storage device controller 24. Also, during a loss of power to the data storage device, the charging circuit 20 is configured to perform backup power load sharing of the data storage device between the first and second battery packs 12, 14. The charging circuit 20 and the controller switch contained therein also are configured to couple the first battery pack 12 and the second battery pack 14 to a DC voltage source 26, which may be regulated by a voltage regulator 28, such as a low dropout (LDO) regulator. Also, the charging circuit 20 and controller switch 22 contained therein are configured to couple the first battery pack 12 and the second battery pack 14 to a learn cycle discharge load or learn load 32, e.g., to perform the battery discharge portion of a battery condition learn cycle.

The first battery pack 12 typically includes a plurality of battery cells, e.g., nine battery cells configured as a pack of three branches connected in parallel with one another, with each branch including three batteries connected in series. The second battery pack 14 includes a similar configuration or other suitable configuration. That is, the second battery pack 14 typically includes a plurality of battery cells, e.g., nine battery cells configured as a pack of three branches connected in parallel with one another, with each branch including three batteries connected in series (i.e., 3s3p). The size of each battery cell and the number of battery cells within each battery pack depends on the particular size of the data storage device or system and the device's battery backup requirements.

The first battery charge capacity gauge 16 and the second battery charge capacity gauge 18 each can be any suitable gauge or other component for reporting the available charge of the corresponding battery pack coupled thereto. For example, one or both of the first and second battery charge capacity gauges 16, 18 can be an impedance tracking gas gauge. Impedance tracking gas gauges typically allow for real-time tracking of battery capacity change, battery impedance, voltage, current, temperature, and other critical information of the battery cells in the battery pack. Impedance tracking gas gauges also often include a self-learning mechanism that accounts for the change of battery impedance and the no-load chemical full capacity (Qmax) due to battery aging.

For example, a typical lithium-ion (Li-ion) battery doubles its impedance after approximately 100 cycles of discharge. Also, battery impedance varies significantly between cells and at different usage conditions, such as temperature and state-of-charge. Therefore, to achieve sufficient accuracy, a relatively large, multidimensional impedance matrix often needs to be maintained in the gauge's flash memory. Although acquiring and implementing such a matrix is relatively difficult and time-consuming, many impedance tracking gas gauges include appropriate technology that significantly simplifies the implementation by continuously updating the battery impedance during the usage lifetime of the battery, and thus only needs a simple, initial impedance database. Temperature and load effects are automatically accounted for when calculating the full-charge capacity (FCC) and the remaining capacity (RM) of the battery. The Qmax also is calculated and updated during the usage of the battery.

Because of its relatively simplified yet accurate operation, an impedance tracking gas gauge typically only requires a 40% depth of discharge (DOD) to update the impedance tables. Therefore, as will be discussed in greater detail hereinbelow, the impedance tracking gas gauge typically does not require the conventional 80% DOD level for a battery being discharged to be considered fully discharged for purposes of a battery pack learn cycle and the subsequent determination of the battery pack's available charge capacity. That is, while conventional charge capacity techniques typically require an 80% depth of discharge, the impedance tracking gas gauge typically only requires a 40% depth of discharge. The reduced DOD level provides a number of advantages, including reduced discharge time and extended battery life. Also, as will be discussed in greater detail hereinbelow, within the battery backup unit 10, the reduced DOD level allows the collective capacity of the learn cycle battery pack and the battery pack or packs remaining at full charge capacity to be sufficient for allowing cached data to be off-loaded to a physical storage device coupled to the data storage device if the data storage device suffers a loss of power. Such collective capacity also remains at a level that does not drop below the system controller's threshold level for switching from write-back caching to write-through caching.

One or more of the first battery charge capacity gauge 16, the controller switch 22 and the second battery charge capacity gauge 18 can be comprised partially or completely of any suitable structure or arrangement, e.g., one or more integrated circuits. Also, it should be understood that the battery backup unit 10 includes other components, hardware and software (not shown) that are used for the operation of other features and functions of the battery backup unit 10 not specifically described herein.

All relevant portions of the battery backup unit 10 can be partially or completely configured in the form of hardware circuitry and/or other hardware components within a larger device or group of components. Alternatively, all relevant portions of the battery backup unit 10 can be partially or completely configured in the form of software, e.g., as processing instructions and/or one or more sets of logic or computer code. In such configuration, the logic or processing instructions typically are stored in a memory element or a data storage device. The data storage device typically is coupled to a processor or controller, e.g., the controller switch 22. The controller accesses the necessary instructions from the data storage element and executes the instructions or transfers the instructions to the appropriate location within the battery backup unit 10.

Conventional battery backup unit arrangements include a single battery pack that typically includes a plurality of battery cells stacked or connected in a manner that provides an appropriate voltage for the given application of the device within which the battery pack in contained. Many conventional battery capacity gauges use a coulomb counting technique, which measures current flow to determine a battery's remaining capacity. However, when performing a battery learn cycle, when discharging the battery, the coulomb counting technique typically requires that the depth of discharge of the battery be approximately 80% to allow for proper coulomb counting.

As discussed hereinabove, discharging a backup battery pack to an 80% depth of discharge level typically triggers the device's system controller to switch from a write-back cache policy to a write-through cache policy, because the discharged battery pack no longer has sufficient capacity to allow the device to completely write (off-load) the cached data in the cache memory element to a physical storage device in the event of a power failure. However, because of the system performance degradation associated with the write-through cache policy, battery packs conventionally are oversized so that an 80% depth of discharge to perform coulomb counting still leaves a suitable amount of charge capacity to allow the device to perform a cache off-load in the event of a power failure, as well as not triggering a system switch from a write-back cache policy to a write-through cache policy. This conventional battery oversizing solution has many disadvantages, including the size and volume (and cost) of the oversized battery pack, as well as the amount of time required to perform an 80% DOD on the oversized battery pack.

According to embodiments of the invention, the battery backup unit 10 is configured to include two (or more) separate battery packs, e.g., the first battery pack 12 and the second battery pack 14, and the charging circuit 20 (e.g., via the controller switch 22) selects or chooses only one battery pack for a learn cycle at any given time. The other (nonselected) battery pack (or packs) remains at full charge capacity. In this manner, the overall available charge capacity of the battery backup unit at any given time, including during a battery learn cycle, will be the combined capacity of the battery pack undergoing a learn cycle (which may be at less than full charge capacity due to learn cycle discharge) and the full charge capacity of the (nonselected) battery pack or packs. It should be noted that, although the battery backup unit 10 includes two or more battery packs, the total charge capacity is properly sized for the needs of the data storage device, i.e., the battery backup unit 10 is not oversized, as in conventional arrangements. Moreover, according to embodiments of the invention, battery charge capacity can be measured using impedance tracking battery capacity charge gauges or other battery charge capacity gauges that do not require a depth of discharge as great as that of conventional coulomb counting methods. Using such battery charge capacity gauges further improves the overall available battery charge capacity, even during a learn cycle battery discharge on one of the two battery packs.

Figure 2:
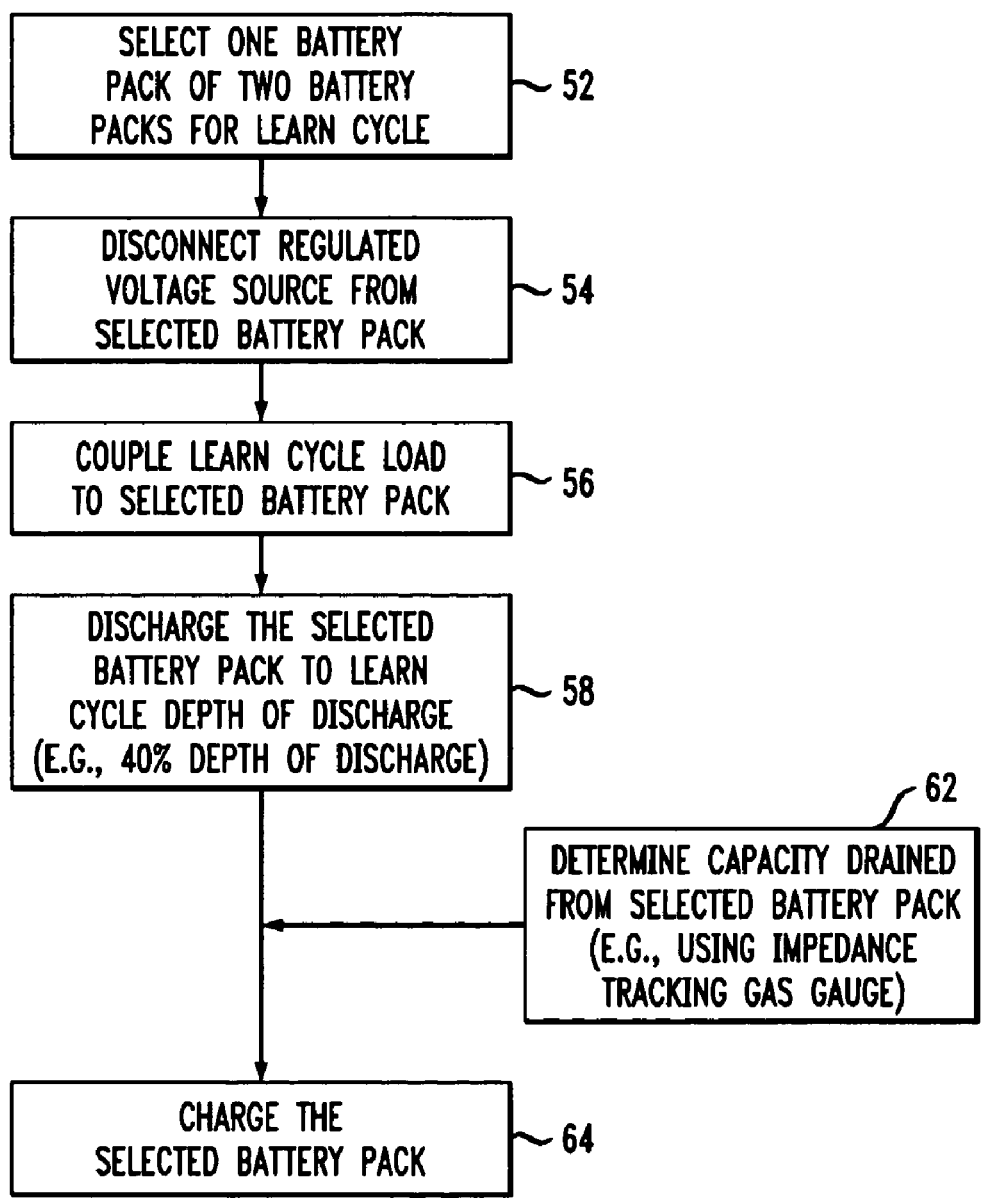
FIG. 2 is a block diagram of a method for improved battery condition learn cycles for batteries included as part of a battery backup unit for use with an electronic data storage system or device, according to embodiments of the invention.

Referring now to FIG. 2, with continuing reference to FIG. 1, shown is a block diagram 50 of a method for improved battery condition learn cycles for battery packs included as part of a battery backup unit, e.g., for use with an electronic data storage system or device. The operation of the battery backup unit 10 will be discussed along with the improved learn cycle method 50. As discussed hereinabove, according to embodiments of the invention, the battery backup unit is configured as two or more separate battery packs. Each battery pack typically includes one or more individual battery cells. For example, according to one embodiment of the invention, the battery backup unit includes eighteen battery cells configured as two nine-cell battery packs, with each of the battery packs configured in a three series by three parallel configuration. That is, each nine-cell battery pack includes three branches connected in parallel, with each branch having three battery cells connected in series.

The method 50 includes a step 52 of selecting one of the two (or more) battery packs for performing a learn cycle. The charging circuit 20, e.g., via the controller switch 22, is configured to select or identify no more than one battery pack at any given time for having a battery condition learn cycle performed thereon. Conventionally, a battery condition learn cycle is performed periodically on a battery backup unit. According to embodiments of the invention, the controller switch 22 periodically selects the first battery pack 12 for a learn cycle. Once the first battery pack learn cycle is complete, the controller switch 22 can then select the second battery pack 14 (or another battery pack) for a learn cycle. Again, at any given time, no more than one battery pack is having a learn cycle performed thereon. Also, the manner in which the controller switch 22 selects the battery packs for a learn cycle can be based on instructions sent from the data storage device controller 24 to the controller switch 22.

The method 50 also includes a step 54 of disconnecting a regulated voltage source from the battery pack selected for the learn cycle. During normal operation, the battery backup unit 10 is coupled (via the charging circuit 20) to a direct current (DC) voltage source 26 regulated by a regulator 28, such as a low dropout (LDO) regulator or other suitable component for regulating the DC voltage applied to the battery backup unit 10. For example, a twenty (20) volt DC voltage source might be regulated to approximately 8.4 volts for use with the battery backup unit 10. However, to properly measure charge capacity drained from a battery pack during the discharge phase of its learn cycle, the regulated DC input voltage must be disconnected. Therefore, prior to any learn cycle being performed on a selected battery pack, the charging circuit 20, e.g., via the controller switch 22, disconnects the regulated DC input voltage source from battery pack selected for a learn cycle. Once the learn cycle is completed, the regulated DC voltage source is reconnected to the battery backup unit 10.

The method 50 also includes a step 56 of coupling a learn cycle load to the battery pack selected for the learn cycle. Once the charging circuit 20, e.g., via the controller switch 22, selects which one of the battery packs is to have a battery condition learn cycle performed thereon, and the regulated DC input voltage has been disconnected from the selected battery pack, the controller switch 22 initiates the learn cycle by coupling the learn cycle discharge load (learn load) 32 to the selected battery pack. At this particular time, the learn load 32 is not coupled to any other battery pack. The learn load 32 is any suitable load capable of discharging the selected battery pack. Typically, the impedance value of the learn load 32 is only a fraction of the actual impedance of the system load of the overall data storage device. The learn load 32 typically is external to the battery backup unit, either contained within the data storage device or external to the data storage device and couple thereto.

Figure 3:
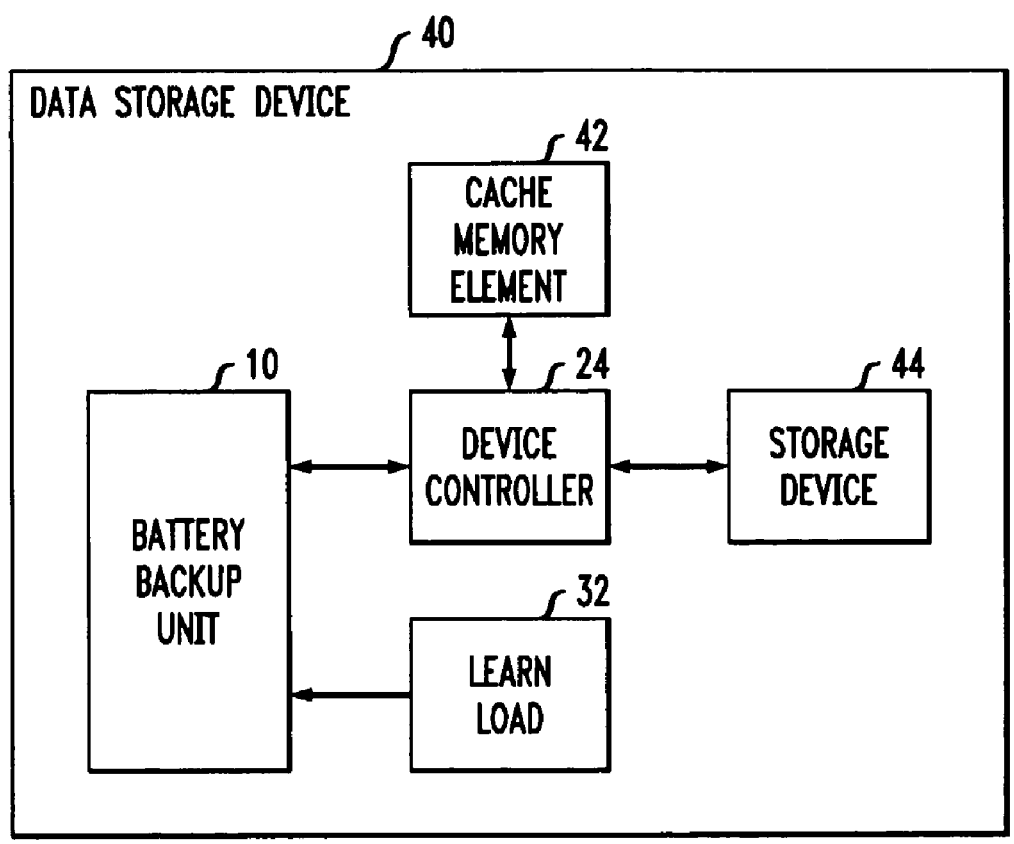
FIG. 3 is a schematic view of an electronic data storage device including the battery backup unit of FIG. 1.

For example, see FIG. 3, which shows an electronic data storage device 40 including the battery backup unit 10 shown in FIG. 1. As shown, the learn cycle discharge load 32 is external to the battery backup unit 10. Also, the learn cycle discharge load 32 is contained within the electronic data storage device 40. Alternatively, the learn cycle discharge load 32 can be external to the electronic data storage device 40 and coupled thereto.

Returning again to FIG. 2, the method 50 also includes a step 58 of discharging the selected battery pack to a learn cycle depth of discharge. Once the learn cycle discharge load 32 has been coupled to the selected battery pack, the controller switch 22 (via the system firmware) monitors the depth of discharge of the selected battery pack down to a learn cycle depth of discharge level. Typically, the learn load depth of discharge level is the depth of discharge level for the selected battery pack to be considered fully discharged for purposes of the discharge phase of the battery learn cycle. For example, conventionally, using coulomb counting methods to determine battery charge capacity, the learn load depth of discharge level typically is approximately 80% of the total charge capacity of the battery pack. That is, conventionally, a battery undergoing a learn cycle typically has 80% of its total capacity discharged during the discharge phase of the learn cycle.

According to embodiments of the invention, the learn load depth of discharge for the selected battery pack is only approximately 40%. Therefore, the selected battery pack only has to have 40% of its total capacity discharged during the discharge phase of the learn cycle. This reduced learn load depth of discharge level is made possible by using impedance tracking gas gauges and similar capacity gauges to determine battery charge capacity, instead of using coulomb counting methods. The reduced learn load depth of discharge saves time, thus reducing the overall time required to perform a battery condition learn cycle. The reduced depth of discharge level also prolongs the life of the battery, over time, as the level of battery discharge (and subsequent charge) is not as much as would occur under conventional learn cycles.

Also, according to an embodiments of the invention, the reduced learn load depth of discharge level leaves more charge capacity available for providing backup power to the data storage device in the event of power loss to the data storage device. Combined with the full charge capacity of the battery pack (or packs) not selected for a learn cycle, the increased charge capacity available from the selected battery pack allows the battery backup unit 10 to maintain a charge capacity level sufficient to allow all of the data stored in the cache memory element (shown as a cache memory element 42 in FIG. 3) of the data storage device 40 to be off-loaded to a non-volatile data storage device (shown as a storage device 44 in FIG. 3). Accordingly, the increased charge capacity available from the selected battery pack combined with the full charge capacity of the battery pack not selected for a learn cycle also is sufficient to keep the device controller 24 from switching from a write-back cache mode to a write-through cache mode. In this manner, system performance degradation attributed to write-through caching is prevented. Moreover, oversizing the battery backup unit to provide enough capacity "head room" to prevent cache policy switching from a write-back cache mode to a write-through cache mode also is avoided.

That is, conventionally, to prevent a device from switching its cache policy from a write-back cache mode to a write-through cache mode, the device's battery backup unit would have to be oversized to the extent that 20% of the total charge capacity of the battery backup unit is a sufficient amount of charge capacity to prevent the device from switching its cache policy from a write-back cache mode to a write-through cache mode. This assumes an 80% depth of discharge during the discharge phase of the learn cycle. According to embodiments of the invention, the battery backup unit only has to be sized so that 60% of the battery pack selected for a learn cycle combined with the full charge capacity of the non-selected battery pack(s) is sufficient to prevent cache policy switching. This assumes a 40% depth of discharge during the discharge phase of the learn cycle.

The method 50 also includes a step 62 of determining the charge capacity drained from the selected battery pack. As discussed, by coupling the learn cycle load 32 to the selected battery pack, the charging circuit 20, via the controller switch 22, initiates the discharge phase of the learn cycle on the selected battery pack. As the selected battery pack is being discharged, the battery charge capacity gauge corresponding to the selected battery pack monitors the amount of charge capacity discharged from the selected battery pack. As discussed hereinabove, an impedance tracking gas gauge only requires a 40% depth of discharge to update the gauge's impedance tables, which are used to determine the amount of available charge capacity of the selected battery pack.

The method 50 also includes a step 64 of charging the selected battery pack. Once the selected battery pack has been discharged sufficiently for purposes of the discharge phase of the learn cycle (e.g., 40% depth of discharge), the controller switch 22 disconnects the learn load 32 from the selected battery pack and initiates the charging phase of the learn cycle. The charging circuit 20 initiates the charging phase of the learn cycle by coupling a switch node of the charging circuit 20 to the selected battery pack. The charging circuit 20 can be any circuit (or component) suitable for charging the battery pack to its full charge capacity. The charging circuit 20 typically is contained within the battery backup unit 10, although the charging circuit 20 can be external to the battery backup unit 10 and coupled thereto.

According to embodiments of the invention, the battery backup unit is configured as two (or more) separate battery packs, and any battery condition learn cycle is performed on only one battery pack at any given time, while the other battery pack (or packs) remains at full charge capacity. Therefore, at any given time, even during a learn cycle, the minimum available charge capacity for the battery backup unit 10 is the full charge capacity of the battery pack or packs not undergoing a learn cycle and the remaining charge capacity of the learn cycle battery pack. Using an impedance tracking gas gauge or other suitable capacity gauge, the available charge capacity of the learn cycle battery pack, even during the discharge phase of the learn cycle, is at least 60% (assuming a 40% depth of discharge) of the total available charge capacity. According to embodiments of the invention, for conventionally-sized battery back units, such minimum available charge capacity usually is sufficient to allow all cached data of the data storage device to be off-loaded to a physical data storage device. Also, even during a learn cycle, the battery backup unit has sufficient charge capacity to prevent the data storage device from switching from a write-back cache mode to a write-through cache mode.

As an example, if a data storage device has a cache policy requirement of 100 amp-hours under a typical system load, a conventional battery backup unit arrangement would have to oversize the battery backup unit to approximately 500 amp-hours to prevent the available battery charge, during a learn cycle (assuming 80% depth of discharge), to fall below the 100 amp-hour threshold level. That is, 20% of 500 amp-hours is 100 amp-hours. By comparison, according to embodiments of the invention, the battery backup unit would have to be sized to provide only 125 amp-hours to maintain a charge capacity of 100 amp-hours, even during a learn cycle. Such requirement would be met by a battery backup unit having two battery packs, each having a full charge capacity of 62.5 amp-hours. That is, 60% (assuming 40% depth of discharge) of 62.5 amp-hours (learn cycle battery pack) is 37.5 amp-hours, combined with 100% of 62.5 amp-hours (battery pack not having the learn cycle performed thereon) is 100 amp-hours. Therefore, in this example, a conventional battery backup unit would have to be 4 times larger than the battery backup unit according to embodiments of the invention to maintain the prescribed charge capacity level throughout a battery condition learn cycle.

It will be apparent to those skilled in the art that many changes and substitutions can be made to the embodiments of the invention herein described without departing from the spirit and scope of the invention as defined by the appended claims and their full scope of equivalents. For example, the battery backup unit can be configured as more than two battery packs, as long as no more than one battery pack is performing a learn cycle at any given time.

The invention claimed is:

1. A battery backup unit for a data storage device, wherein the data storage device includes a cache memory element configured to store data therein, the battery backup unit comprising:
    a plurality of battery cells configured as a first battery pack having a first charge capacity and at least one second battery pack having a second charge capacity;
    a first battery charge capacity gauge coupled to the first battery pack;
    a second battery charge capacity gauge coupled to the second battery pack; and
    a charging circuit coupled between the first battery pack and the at least one second battery pack, wherein the charging circuit includes a controller switch,
    wherein the controller switch is configured to couple a learn cycle load and the charging circuit between the first and second battery packs in such a manner that no more than one battery pack performs a battery learn cycle at a given time,
    wherein the battery packs and the charging circuit are configured within the battery backup unit in such a way that the overall available charge capacity of the battery backup unit at any given time is the combined capacity of the battery pack being discharged during the battery learn cycle and the full charge capacity of the battery pack not being discharged,
    wherein the first and second battery charge capacity gauges are configured in such a manner that, during a battery learn cycle performed by the corresponding battery pack, a depth of discharge level of the corresponding battery pack is such that at least a portion of the first charge capacity of the battery pack being discharged during the learn cycle combined with at least a portion of the second charge capacity of the battery pack not being discharged is sufficient to allow the data stored in the cache to be off-loaded to a physical data storage device when coupled to the data storage device.

2. The device as recited in claim 1, wherein the depth of discharge level of the battery pack being discharged is such that the first charge capacity of the battery pack being discharged combined with the second charge capacity of the battery pack not being discharged is greater than a threshold level below which the data storage device will switch from a write-back cache mode to a write-through cache mode.

3. The device as recited in claim 1, wherein at least one of the first and second battery charge capacity gauges further comprises an impedance tracking gas gauge.

4. The device as recited in claim 1, wherein the battery backup unit includes eighteen battery cells, and wherein each of the first battery pack and the second battery pack comprises nine battery cells configured as three branches connected in parallel to one another, wherein each branch includes three battery cells connected in series.

5. The device as recited in claim 1, wherein the depth of discharge (DOD) level of the battery pack performing the battery learn cycle is approximately 40% of the full charge capacity of the battery pack.

6. The device as recited in claim 1, wherein the charge capacity of the battery pack not performing the battery learn cycle remains at 100% of charge capacity.

7. The device as recited in claim 1, wherein the data storage device includes a system load, and wherein the controller switch is further configured to perform load sharing between the first battery pack and the second battery pack by switchably coupling the first battery pack and the second battery pack to the system load of the data storage device.

8. The device as recited in claim 1, wherein the data storage device includes a regulated direct current (DC) voltage source coupled to the controller switch, and wherein the controller switch is configured to disconnect the regulated DC voltage source from the controller switch before coupling the learn cycle load to the battery pack performing the battery learn cycle.

9. The device as recited in claim 1, wherein at least one of the first and second battery packs includes a plurality of lithium ion batteries.

10. A method for performing a battery learn cycle on a battery backup unit for a data storage device, wherein the data storage device includes a cache memory element, wherein the battery backup unit includes a plurality of battery cells, the method comprising the steps of:
configuring the plurality of battery cells as a first battery pack and at least one second battery pack, wherein the battery backup unit includes a first battery charge capacity gauge coupled to the first battery pack, a second battery charge capacity gauge coupled to the second battery pack, and a charging circuit coupled between the first battery pack and the second battery pack, wherein the charging circuit includes a controller switch;
selecting by the controller switch no more than one of the first battery pack and the second battery pack on which to perform a learn cycle, wherein the battery packs and the charging circuit are configured within the battery backup unit in such a way that the overall available charge capacity of the battery backup unit at any given time is the combined capacity of the battery pack being discharged during the battery learn cycle and the full charge capacity of the battery pack not being discharged; and
discharging the selected battery pack by the controller switch coupling a learn cycle load to the selected battery pack, wherein the selected battery pack is discharged to a learn cycle depth of discharge level, wherein the learn cycle depth of discharge level is such that the remaining charge capacity of the selected battery pack combined with the charge capacity of the battery pack not selected on which to perform a learn cycle is sufficient to allow the data storage device to off-load cached data stored in the cache memory element to a physical data storage device when coupled to the data storage device.

11. The method as recited in claim 10, wherein the discharging step discharges the selected battery pack to a learn cycle depth of discharge level such that the remaining charge capacity of the selected battery pack being discharged combined with the charge capacity of the battery pack not being discharged is greater than a threshold level below which the data storage device will switch from a write-back cache mode to a write-through cache mode.

12. The method as recited in claim 10, further comprising the step of determining the charge capacity drained from the selected battery pack during the discharging step.

13. The method as recited in claim 12, wherein the determining step is performed using an impedance tracking gas gauge.

14. The method as recited in claim 10, wherein the discharging step discharges the selected battery pack to a learn cycle depth of discharge level of approximately 40% of the full charge capacity of the selected battery pack.

15. The method as recited in claim 10, wherein the discharging step includes, at any given time, discharging no more than one battery pack while all other battery packs remain at full charge capacity.

16. The method as recited in claim 10, wherein the data storage device includes a regulated direct current (DC) voltage source coupled to the controller switch, and wherein the method further comprises the step of disconnecting the regulated DC voltage source from the controller switch before discharging the selected battery pack.

17. The method as recited in claim 10, further comprising the step of charging the selected battery pack by coupling the charging circuit to the selected battery once the selected battery has been discharged up to the learn cycle depth of discharge level.

18. A data storage device, comprising:
a cache memory element configured for storing cache data therein and for coupling to a physical data storage device;
a battery backup unit, comprising
a plurality of battery cells configured as a first battery pack and at least one second battery pack,
a first impedance tracking gas gauge coupled to the first battery pack,
a second impedance tracking gas gauge coupled to the second battery pack, and
a battery charging circuit coupled between the first battery pack and the at least one second battery pack, wherein the battery charging circuit includes a controller switch;
a learn cycle discharge load coupled to the controller switch; and
a device controller coupled to the cache memory element and the controller switch, and configured for coupling the cache memory element to the physical data storage device,
wherein the controller switch is configured to couple the learn cycle load and the charging circuit between the first and second battery packs in such a manner that no more than one battery pack performs a battery learn cycle at any given time, and
wherein the battery packs and the charging circuit are configured within the battery backup unit in such a way that the overall available charge capacity of the battery backup unit at any given time is the combined capacity of the battery pack being discharged during the battery learn cycle and the full charge capacity of the battery pack not being discharged, and
wherein the first and second battery charge capacity gauges are configured in such a manner that, during a battery learn cycle performed by the corresponding battery pack, the depth of discharge level of the corresponding battery pack is such that at least a portion of the charge capacity of the battery pack being discharged during the learn cycle combined with at least a portion of the charge capacity of the battery pack not being discharged is sufficient to allow the data stored in the cache memory element to be off-loaded to the physical data storage device when coupled to the data storage device.

19. The device as recited in claim 18, wherein the depth of discharge level of the battery pack being discharged is such that the charge capacity of the battery pack being discharged combined with the charge capacity of the battery pack not being discharged is greater than a threshold level below which the data storage device will switch from a write-back cache mode to a write-through cache mode.

20. The device as recited in claim 18, wherein at least one of the first and second battery charge capacity gauges further comprises an impedance tracking gas gauge.

* * * * *